US007443219B2

(12) United States Patent
Rausch

(10) Patent No.: US 7,443,219 B2
(45) Date of Patent: Oct. 28, 2008

(54) PHASE INTERPOLATION APPARATUS, SYSTEMS, AND METHODS

(75) Inventor: Gregory Jason Rausch, Plymouth, MN (US)

(73) Assignee: Micron Technology, Inc., Boise, ID (US)

( * ) Notice: Subject to any disclaimer, the term of this patent is extended or adjusted under 35 U.S.C. 154(b) by 105 days.

(21) Appl. No.: 11/649,435

(22) Filed: Jan. 4, 2007

(65) Prior Publication Data

US 2008/0164928 A1    Jul. 10, 2008

(51) Int. Cl.
*H03H 11/16* (2006.01)
(52) U.S. Cl. .................. 327/231; 327/235; 708/290
(58) Field of Classification Search .................. 327/231, 327/234, 235, 245, 247–249; 708/290, 847; 375/273, 279, 280
See application file for complete search history.

(56) References Cited

U.S. PATENT DOCUMENTS 4,686,688 A * 8/1987 Chung et al. ................ 375/274

5,541,961 A * 7/1996 Farrow ....................... 375/371

* cited by examiner

*Primary Examiner*—N. Drew Richards
*Assistant Examiner*—An T. Luu
(74) *Attorney, Agent, or Firm*—Schwegman, Lundberg & Woessner, P.A.

(57) ABSTRACT

A phase interpolator circuit may comprise a multiplexer circuit (MUX) coupled to a plurality of clock signals at MUX inputs and may provide a first clock signal and a second clock signal at MUX outputs that are out of phase with each other, a digital to analog converter circuit (DAC) to convert a digital input to first and second DAC current outputs such that a sum of the first and second DAC output currents comprises a substantially constant current value, a weighted averager circuit coupled to the MUX and the DAC, and a variable capacitive load circuit coupled to the first and second DAC current outputs. The weighted averager circuit may operate to sum weighted first and second clock signals and to output a phase interpolated clock signal, wherein the first clock signal is weighted according to a first DAC output current and the second clock signal is weighted according to a second DAC output current. Other apparatus, systems, and methods are disclosed.

27 Claims, 10 Drawing Sheets

| MUX SELECT BITS | | | DAC INPUTS | | | PHASE PLACEMENT (THEORETICAL) |
|---|---|---|---|---|---|---|
| S2 | S1 | S0 | D2 | D1 | D0 | |
| 0 | 0 | 0 | 0 | 0 | 0 | 0 |
| 0 | 0 | 0 | 0 | 0 | 1 | 6.43 |
| 0 | 0 | 0 | 0 | 1 | 0 | 12.86 |
| 0 | 0 | 0 | 0 | 1 | 1 | 19.29 |
| 0 | 0 | 0 | 1 | 0 | 0 | 25.72 |
| 0 | 0 | 0 | 1 | 0 | 1 | 32.15 |
| 0 | 0 | 0 | 1 | 1 | 0 | 38.58 |
| 0 | 0 | 0 | 1 | 1 | 1 | 45 |
| 0 | 0 | 1 | 1 | 1 | 1 | 45 |
| 0 | 0 | 1 | 1 | 1 | 0 | 51.43 |
| 0 | 0 | 1 | 1 | 0 | 1 | 57.86 |
| 0 | 0 | 1 | 1 | 0 | 0 | 64.29 |
| 0 | 0 | 1 | 0 | 1 | 1 | 70.72 |
| 0 | 0 | 1 | 0 | 1 | 0 | 77.15 |
| 0 | 0 | 1 | 0 | 0 | 1 | 83.58 |
| 0 | 0 | 1 | 0 | 0 | 0 | 90 |
| 0 | 1 | 0 | 0 | 0 | 0 | 90 |
| 0 | 1 | 0 | 0 | 0 | 1 | 96.43 |
| 0 | 1 | 0 | 0 | 1 | 0 | 102.86 |
| 0 | 1 | 0 | 0 | 1 | 1 | 109.29 |
| 0 | 1 | 0 | 1 | 0 | 0 | 115.72 |
| 0 | 1 | 0 | 1 | 0 | 1 | 122.15 |
| 0 | 1 | 0 | 1 | 1 | 0 | 128.58 |
| 0 | 1 | 0 | 1 | 1 | 1 | 135 |
| 0 | 1 | 1 | 1 | 1 | 1 | 135 |
| 0 | 1 | 1 | 1 | 1 | 0 | 141.43 |
| 0 | 1 | 1 | 1 | 0 | 1 | 147.86 |
| 0 | 1 | 1 | 1 | 0 | 0 | 154.29 |
| 0 | 1 | 1 | 0 | 1 | 1 | 160.72 |
| 0 | 1 | 1 | 0 | 1 | 0 | 167.15 |
| 0 | 1 | 1 | 0 | 0 | 1 | 173.58 |
| 0 | 1 | 1 | 0 | 0 | 0 | 180 |

*FIG. 4*

| MUX SELECT BITS | | | DAC INPUTS | | | PHASE PLACEMENT |
| --- | --- | --- | --- | --- | --- | --- |
| S2 | S1 | S0 | D2 | D1 | D0 | (SOLUTION) |
| 0 | 0 | 0 | 0 | 0 | 0 | 2.81 |
| 0 | 0 | 0 | 0 | 0 | 1 | 8.43 |
| 0 | 0 | 0 | 0 | 1 | 0 | 14.05 |
| 0 | 0 | 0 | 0 | 1 | 1 | 19.67 |
| 0 | 0 | 0 | 1 | 0 | 0 | 25.29 |
| 0 | 0 | 0 | 1 | 0 | 1 | 30.91 |
| 0 | 0 | 0 | 1 | 1 | 0 | 36.53 |
| 0 | 0 | 0 | 1 | 1 | 1 | 42.15 |
| 0 | 0 | 1 | 1 | 1 | 1 | 47.77 |
| 0 | 0 | 1 | 1 | 1 | 0 | 53.39 |
| 0 | 0 | 1 | 1 | 0 | 1 | 59.01 |
| 0 | 0 | 1 | 1 | 0 | 0 | 64.63 |
| 0 | 0 | 1 | 0 | 1 | 1 | 70.25 |
| 0 | 0 | 1 | 0 | 1 | 0 | 75.87 |
| 0 | 0 | 1 | 0 | 0 | 1 | 81.49 |
| 0 | 0 | 1 | 0 | 0 | 0 | 87.11 |
| 0 | 1 | 0 | 0 | 0 | 0 | 92.73 |
| 0 | 1 | 0 | 0 | 0 | 1 | 98.35 |
| 0 | 1 | 0 | 0 | 1 | 0 | 103.97 |
| 0 | 1 | 0 | 0 | 1 | 1 | 109.59 |
| 0 | 1 | 0 | 1 | 0 | 0 | 115.21 |
| 0 | 1 | 0 | 1 | 0 | 1 | 120.83 |
| 0 | 1 | 0 | 1 | 1 | 0 | 126.45 |
| 0 | 1 | 0 | 1 | 1 | 1 | 132.07 |
| 0 | 1 | 1 | 1 | 1 | 1 | 137.69 |
| 0 | 1 | 1 | 1 | 1 | 0 | 143.31 |
| 0 | 1 | 1 | 1 | 0 | 1 | 148.93 |
| 0 | 1 | 1 | 1 | 0 | 0 | 154.55 |
| 0 | 1 | 1 | 0 | 1 | 1 | 160.17 |
| 0 | 1 | 1 | 0 | 1 | 0 | 165.79 |
| 0 | 1 | 1 | 0 | 0 | 1 | 171.41 |
| 0 | 1 | 1 | 0 | 0 | 0 | 177.03 |

*FIG. 8*

```
                    ┌─ 1105
┌─────────────────────────────────────────────┐
│ APPLYING A FIRST CLOCK SIGNAL TO A FIRST BUFFER │
│ AND A SECOND CLOCK SIGNAL TO A SECOND BUFFER,  │
│ WHEREIN THE SECOND CLOCK SIGNAL IS OUT OF PHASE│
│       WITH THE FIRST CLOCK SIGNAL              │
└─────────────────────────────────────────────┘
                    │
                    ▼          ┌─ 1110
┌─────────────────────────────────────────────┐
│ WEIGHTING THE FIRST AND SECOND CLOCK SIGNALS USING │
│ FIRST AND SECOND OUTPUTS OF A DIGITAL-TO-ANALOG   │
│           CONVERTER CIRCUIT (DAC)                │
└─────────────────────────────────────────────┘
                    │
                    ▼          ┌─ 1115
┌─────────────────────────────────────────────┐
│   CHANGING A CAPACITIVE LOAD ON THE FIRST AND   │
│            SECOND DAC OUTPUTS                   │
└─────────────────────────────────────────────┘
                    │
                    ▼          ┌─ 1120
┌─────────────────────────────────────────────┐
│ SUMMING THE WEIGHTED FIRST AND SECOND CLOCK SIGNALS │
│  TO CREATE A PHASE INTERPOLATED CLOCK SIGNAL      │
└─────────────────────────────────────────────┘
                    │
                    ▼          ┌─ 1125
┌─────────────────────────────────────────────┐
│   SWEEPING A PHASE OF THE PHASE INTERPOLATED    │
│ CLOCK SIGNAL BY CHANGING THE WEIGHTING OF THE   │
│  FIRST AND SECOND CLOCK SIGNALS BY CHANGING A   │
│              DAC INPUT                          │
└─────────────────────────────────────────────┘
```

*FIG. 11*

PHASE INTERPOLATION APPARATUS, SYSTEMS, AND METHODS

RELATED PATENT APPLICATION

This document is related to co-pending, commonly assigned, U.S. patent application Ser. No. 11,649,434, entitled "Phase Interpolation Apparatus, Systems, and Methods," filed Jan. 4, 2007, incorporated herein by reference in its entirety.

TECHNICAL FIELD

The embodiments disclosed generally relate to electronic circuits, including clock circuits.

BACKGROUND

A phase interpolator circuit can be used to provide a set of clock signals that may each include a phase offset from the other clock signals in the set. This set of phase offset clock signals can be used to provide one or more clock signals having a clock edge with a desired relationship to another signal, typically a data signal. For example, in some applications data is communicated between two integrated circuits that do not share a common clock. A phase interpolator circuit can be used to provide multiple clocks to the receiving integrated circuit, one of which is selected as an internal clock for data sampling.

In another example, multiple clock signals may be automatically and successively switched to sweep the clock phases as they are provided to a circuit. This latter implementation can provide timing measurements with increased resolution for high speed circuit testing. In many cases, it is desired that the clock phase sweeping operation be substantially error-free.

BRIEF DESCRIPTION OF THE DRAWINGS

FIG. 4 is a table illustrating sweeping an output clock phase, according to various embodiments of the invention.

FIG. 8 is a table illustrating sweeping an output clock phase, according to various embodiments of the invention.

FIG. 11 is a flow diagram of a method of interpolating the phase of a clock signal, according to various embodiments of the invention.

DETAILED DESCRIPTION

To meet the challenges described above, some embodiments may operate to receive clock signals at multiplexer (MUX) inputs and to output clock signals that are out of phase with each other. A digital to analog converter (DAC) may be used to convert a digital input to first and second DAC output currents such that their sum comprises a substantially constant current value. A weighted averager circuit, coupled to the MUX and the DAC, may sum weighted first and second clock signals to output a phase interpolated clock signal. The first clock signal may be weighted according to the first DAC output current, and the second clock signal may be weighted according to the second DAC output current. A variable capacitive load circuit may be coupled to the first and second DAC current outputs. The phase of the interpolated clock signal may be swept by changing the weighting of the first and second clock signals.

Figure 1:
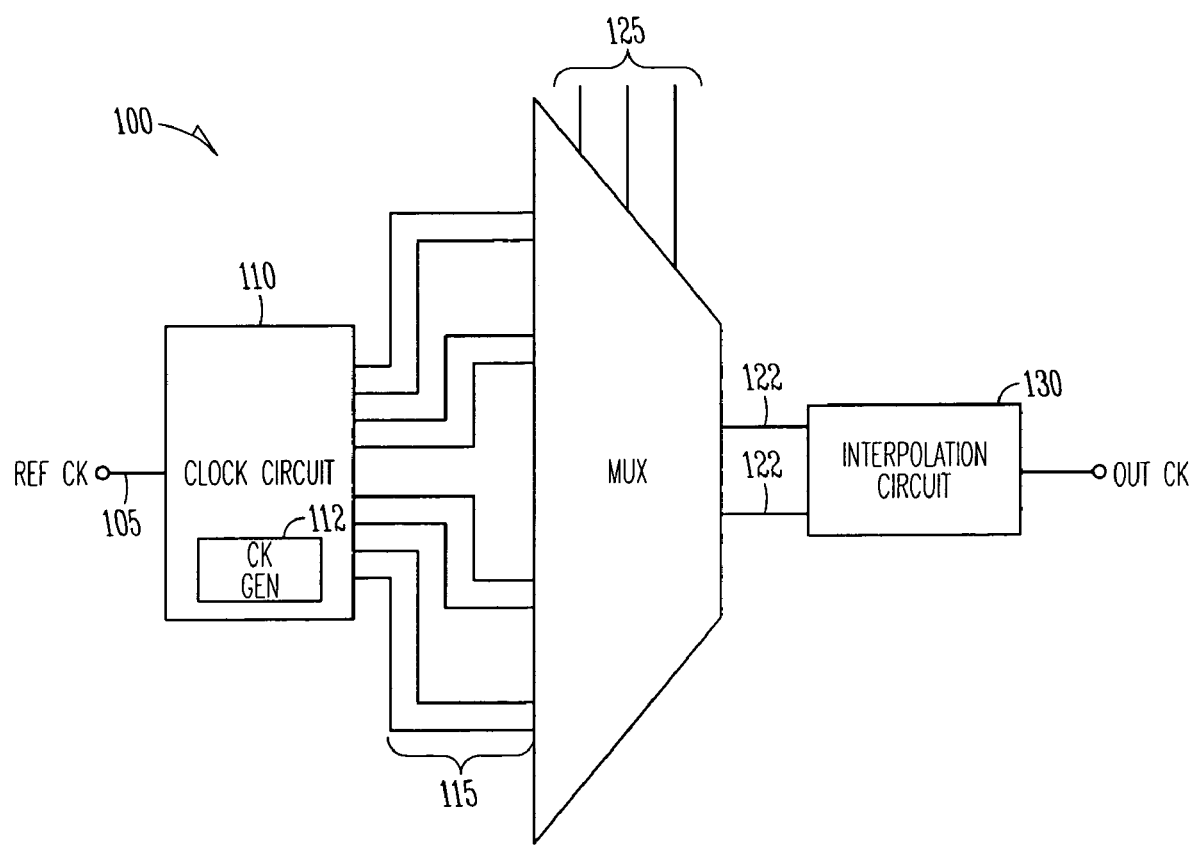
FIG. 1 is a block diagram of portions of a system to generate clocks having phases different from a reference clock signal, according to various embodiments of the invention.

FIG. 1 is a block diagram of portions of a system 100 to generate clocks 115 having phases different from a reference clock signal 105, according to various embodiments of the invention. Here it can be seen that a reference clock signal 105 may be provided to a clock circuit 110 to produce a set of reference phase clock signals 115. The reference phase clock signals 115 may include phases evenly spaced across 360° of phase space. In some embodiments, the clock circuit 110 includes a clock generator 112, such as a phase locked loop (PLL), to generate the reference phases of the clock signals 115, and in some embodiments, the clock generator 112 includes a delay locked loop (DLL), perhaps used for substantially the same purpose. The reference phase clock signals 115 may then be provided to a multiplexer circuit or MUX 120, which includes circuitry for selecting one or more pairs of clock signals (i.e., selected clock signals 122) according to the applied MUX select bits 125. The system 100 may include an interpolation circuit 130 that interpolates between the phases of the selected clock signals 122 to provide an output clock signal OUTCK having changeable phase.

Figure 2:
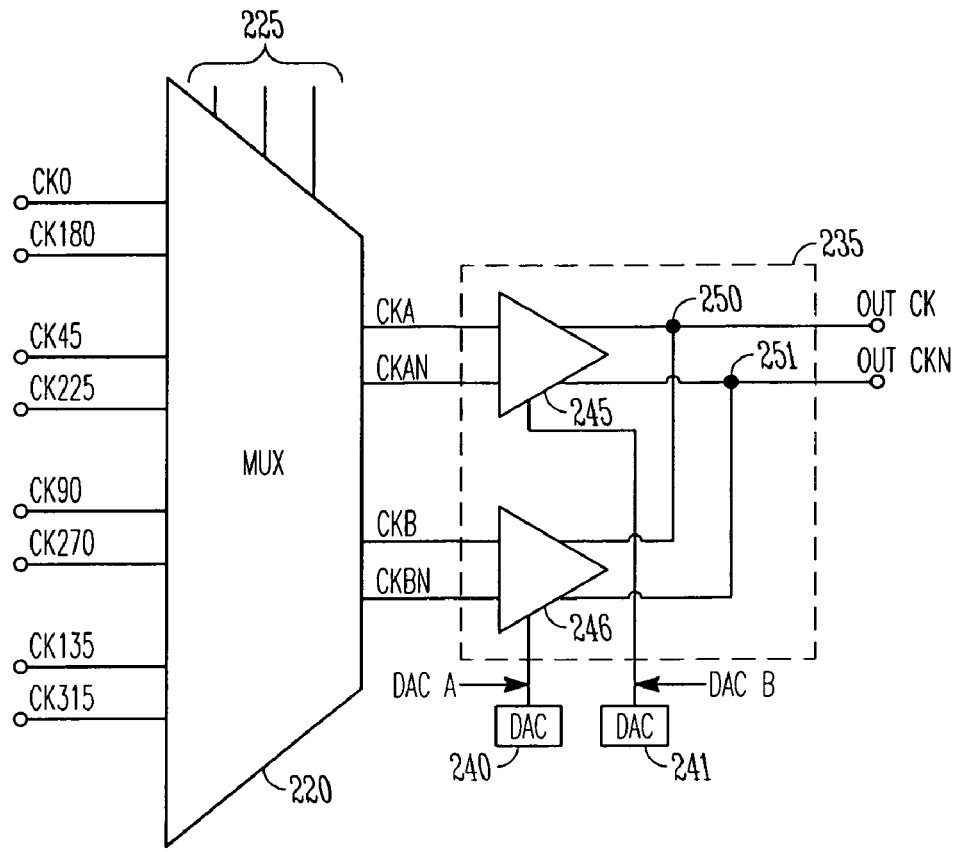
FIG. 2 shows a block diagram of portions of a phase interpolator circuit, according to various embodiments of the invention.

FIG. 2 shows a block diagram of portions of a phase interpolator circuit 200, which may be similar to or identical to the circuit 130 shown in FIG. 1. A set of eight reference phase clock signals CK0, CK180, CK45, CK225, CK90, CK270, CK135, and CK 315 may be received by a MUX 220. A pair of reference clock signals CKA, CKB and their inverse clock signals CKAN, CKBN may be selected from the reference phase clock signals and output from the MUX 220. Note that the reference phase clock signal with 180° phase is an inverse of the clock signal with 0° phase and vice versa. Thus, in one selected pair (i.e., CK0, CK180) the clock signal may have a phase of 0° and the inverse has a phase of 180°, and in another selected pair (i.e., CK180, CK0), the clock signal may have a phase of 180° and the inverse is 0°.

A weighted averager circuit 235 may receive the reference clock signals CKA, CKB and their inverse clock signals CKAN, CKBN from the MUX 220 and may provide them to two differential buffers 245, 246, such as analog signal buffers for example. The outputs of the differential buffers 245, 246 may then be combined at summing nodes 250, 251 to produce an output clock OUTCK with a phase interpolated between the pair of clock signals CKA, CKB.

The phase interpolator circuit 200 may include two DACs 240, 241, which may operate to convert a digital input signal into an analog electrical signal (i.e., a current or a voltage).

Here, the DACs 240, 241 each convert a digital input signal into a current used to weight the outputs of the differential buffers 245, 246. In some embodiments, the DACs 240, 241 bias the output drive of the differential buffers 245, 246 by sinking current. To sweep the phase of the output clock signal OUTCK, the digital input to the DACs 240, 241 and the select bits 225 of the MUX may be changed to create different weighted combinations of the clock signals CKA, CKB.

Sources of error in creating the output clock OUTCK with interpolated phase include phase shrinkage and integral non-linearity error (INL) as the MUX select bits 225 are changed. Phase shrinkage may be manifested near a MUX boundary, such as where the MUX 220 operates to select a new clock pair. These potential sources of error will be discussed in more detail below.

Figure 3:
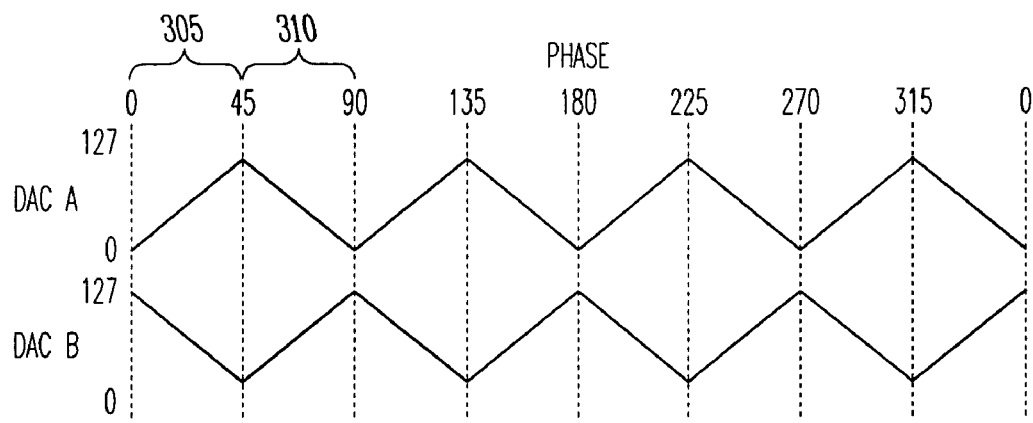
FIG. 3 illustrates eight reference phase clock signals used to sweep an output clock phase through 360°, according to various embodiments of the invention.

FIG. 3 illustrates eight reference phase clock signals used to sweep an output clock phase through 360°. As shown, the reference phase clock signals have phases spaced at 0°, 45°, 90°, 135°, 180°, 225°, 270°, and 315°, respectively. Here, two of the reference phase clock signals that are forty-five degrees out of phase are combined, along with their inverse signals, to sweep the phase of the output clock signal OUTCK through each forty-five degree phase segment. Thus, reference phase clock signals CK0, CK45 having phase shifts of 0° and 45° are combined in the first segment 305, reference phase clock signals CK45, CK90 having phases of 45° and 90° are combined in the second segment 310, and so on.

The two DAC output signals, DAC A and DAC B, correspond to the output signals from DACs 240 and 241 respectively, as seen in FIG. 2. The DACs 240, 241 are used to weight the combination of the reference signals CKA, CKB to produce the output clock signal OUTCK. DAC A and DAC B may be current outputs provided to the output stage of the differential amplifiers 245, 246. Because the amount of current supplied determines the strength of the output drive of the buffers, the relative magnitudes of the separate current drives can determine how much of the resulting phase is due to the CKA or the CKB input.

In some embodiments, the DACs 240, 241 include seven-bit digital inputs that are decoded to $2^7$, or 128, levels of analog output numbered zero to 127. To create the 0° phase, the first reference phase clock signal CKA may be weighted fully with DAC B using a DAC 241 count of 127 and the output of the first, or even, differential buffer 245 is fully on. The second reference signal CKB is given the least weight with DAC A using a DAC 240 count of 0 and the output of the second, or odd, differential buffer 246 is fully off. To sweep the phase, DAC 241 decrements to gradually turn off the output drive of the first differential buffer 245, and DAC 240 increments to gradually turn on the output of the second differential buffer output 246. When DAC 241 decrements to zero, the output of the first differential buffer 245 is turned off.

The MUX select bits 225 may then be changed to select the third reference phase clock signal CK90 that has a phase shift of 90°. CK90 is applied to the first differential buffer 245 which is still off. DAC 240 decrements, decreasing the output of DAC A, while DAC 241 increments, increasing the output of DAC B to gradually turn off the output of the second differential buffer 246 as the phase is swept from 45° to 90°.

FIG. 4 is a table illustrating sweeping an output clock phase. For simplicity, only a three-bit digital input for eight steps of output from DAC A are shown, and only the digital input for DAC 240 is shown. It should be noted that, as shown in FIG. 3, the output of DAC A increases while the output of DAC B decreases. An extra-long step may be seen at 45° when the output drive of the first differential buffer 245 is turned off and the MUX select bits 225 change from "000" to "001" to select the third reference clock having a phase of 90°. This extra-long step is primarily due to coupling capacitance between the outputs of the two differential buffers 245, 246. An extra-long step may occur whenever the MUX select bits 225 are changed, which leads to phase shrinkage (e.g., as mentioned above, and indicated here with respect to phase angles of 90° and 135° in FIG. 4).

Ideally, a DAC should have a transfer function that is a straight line. INL error in data converters such as DACs is one type of deviation from the ideal straight line transfer function. Phase-to-Phase INL error may thus manifest itself as a non-linear curve at the DAC output, perhaps as a parabolic curve, or an S-curve.

Figure 5:
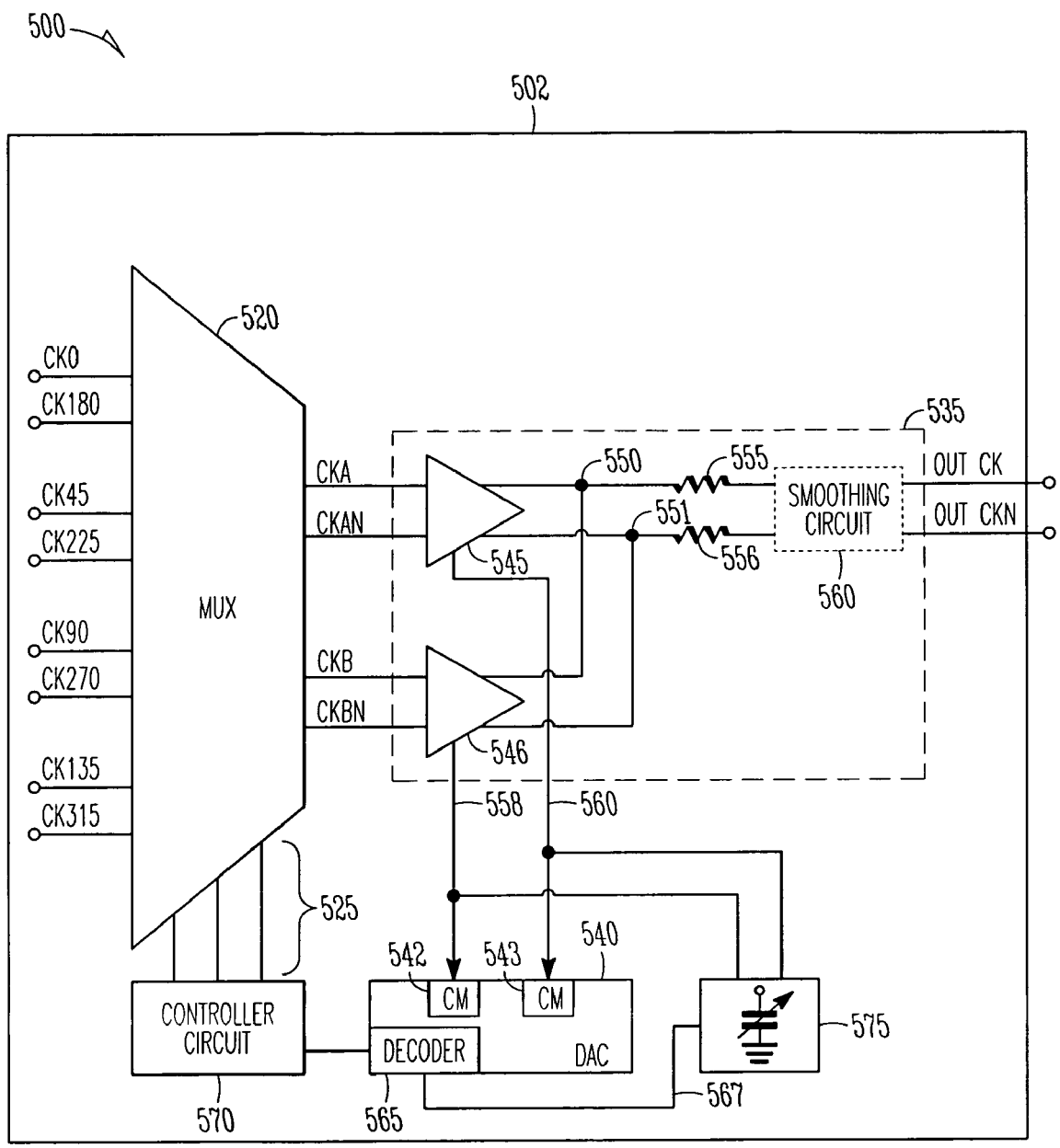
FIG. 5 is a block diagram of portions of a phase interpolator circuit, according to various embodiments of the invention.

FIG. 5 is a block diagram of portions of a phase interpolator circuit 500. According to some embodiments, the phase interpolator circuit 500 is included in an integrated circuit (IC) package 502. A set of eight reference phase clock signals CK0, CK180, CK45, CK225, CK90, CK270, CK135, and CK315 are created from a reference clock using a clock circuit (not shown). The reference phase clock signals CK0, CK180, CK45, CK225, CK90, CK270, CK135, and CK315 are received by the MUX 520. The MUX 520 can be used to select a pair of the reference phase clock signals and their inverses so as to provide a first clock signal CKA and a second clock signal CKB that are out of phase with each other. The MUX 520 also outputs the inverse clocks CKAN and CKBN. A weighted averager circuit 535 may receive the clock signals CKA, CKAN, CKB, CKBN output from the MUX 520 into two differential buffers 545, 546. The outputs of the differential buffers 545, 546 may be combined at summing nodes 550, 551 to produce an output clock OUTCK with a phase interpolated between the phases of the input pair of clock signals CKA, CKB. In some embodiments, the summing nodes 550, 551 are connected to output loads 555, 556 and a smoothing circuit 560.

The phase interpolator circuit 500 may include one or more DACs 540. For example, the DAC 540 may operate to decode a single digital input to drive two current mirrors 542, 543, providing two DAC output currents 558, 560 to bias the output drive of the differential buffers 545, 546. The DAC 540 may include a decoder 565 to decode the digital input to the DAC. In some embodiments, the first output current 558 is determined according to a decoding of the digital input of the decoder 565, and the second output current 560 is determined according to a complement of the decoding of the digital input of the decoder 565. As the first DAC output 558 increases according to a change in the digital input provided by the controller circuit 570, the second DAC output 560 current may decrease. The sum of the two DAC output currents 558, 560 may then comprise a substantially constant value of current and the output phase may change according to the relative proportion of the currents. The first DAC output current 558 may be used to weight the first clock output signal CKA by adjusting an output drive of the first differential buffer 545. The second DAC output current 560 may be used to weight the second clock output signal CKB by adjusting an output drive of the second differential buffer 546.

The controller circuit 570 can be any logic circuit that can manipulate the digital input to the decoder 565 and the select bits of the MUX 525, such as a binary counter, a memory to store the input values, a processor, and the like. In some embodiments, a tri-state circuit is included in the output stage of the differential buffers 545, 546, such that the output of a differential buffer 545 can be tri-stated (i.e., set to a high impedance state) when the buffer 545 receives the lowest weighting DAC output current. In some embodiments, this can be when the output current turns the output of the buffer 545 off.

Figure 6A:
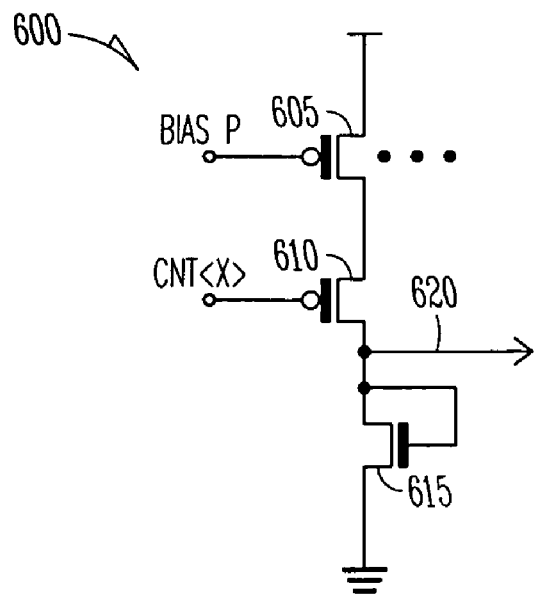
FIGS. 6A, 6B are schematic diagrams of DAC (digital to analog converter) bit circuits, according to various embodiments of the invention.

FIG. 6A is a schematic diagram of a DAC bit circuit 600. The DAC bit circuit 600 may comprise a current mirror circuit enabled by a decoder. As shown, the gate of bias PMOS (p-type metal oxide semiconductor) transistor 605 is connected to a bias voltage BIAS P. The DAC bit circuit 600 also includes NMOS (n-type metal oxide semiconductor) transistor 615 and a control PMOS transistor 610 connected to a decoded count signal CNT<X>. If the DAC decodes 7 inputs to 128 bits, X is a number from 0 to 127 and the DAC includes 128 DAC bit circuits 600.

The size of the current provided in each DAC bit circuit 600 is determined by the size of the bias PMOS transistor 605 and the gate bias voltage, BIAS P. When the control PMOS transistor 610 is on, current is sunk by NMOS transistor 615. To form a current mirror, another NMOS transistor (shown below in FIG. 7) may have its gate connected to the gate of NMOS transistor 615. Because the gates of the two transistors have the same gate voltage, the current sunk by the current mirror is the same as that provided by all the DAC bit circuits 600 that have the control PMOS transistor 610 on.

In the embodiments represented by FIG. 2, for example, there might be a set of DAC bit circuits for DAC A and a set for DAC B. The DAC bit circuit 600 in FIG. 6A may be susceptible to current leakage when some of the control transistors 610 and current mirrors are turned off. Some DAC bit circuits may have less current leakage, as may be the case for the circuit in FIG. 6B.

Figure 6B:
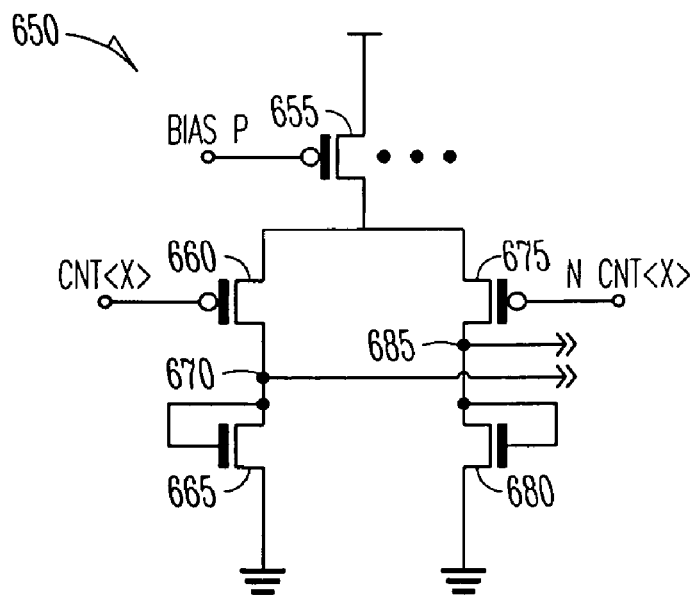

FIG. 6B is also a schematic diagram of a DAC bit circuit 650. The DAC bit circuit 650 may include a bias PMOS transistor 655 having a source connected to a supply voltage and a gate connected to a bias voltage (BIAS P). The DAC bit circuit 650 may also include a first control PMOS transistor 660 having a source connected to a drain of the bias PMOS transistor 655, a gate connected to a decoder output corresponding to a decoded digital input, and a drain connected to NMOS transistor 665 and a first current mirror connected to circuit node 670. The DAC bit circuit 650 may further include a second control PMOS transistor 675 having a source connected to the drain of the bias PMOS transistor 655, a gate connected to a decoder output corresponding to a decoded complement of the digital input, and a drain connected to NMOS transistor 680 and a second current mirror connected to circuit node 685. While a particular arrangement of PMOS and NMOS transistors has been described with respect to FIGS. 6A and 6B, those of ordinary skill in the art will realize that complementary transistor types may be substituted as well (e.g., NMOS for PMOS, etc.).

Figure 7:
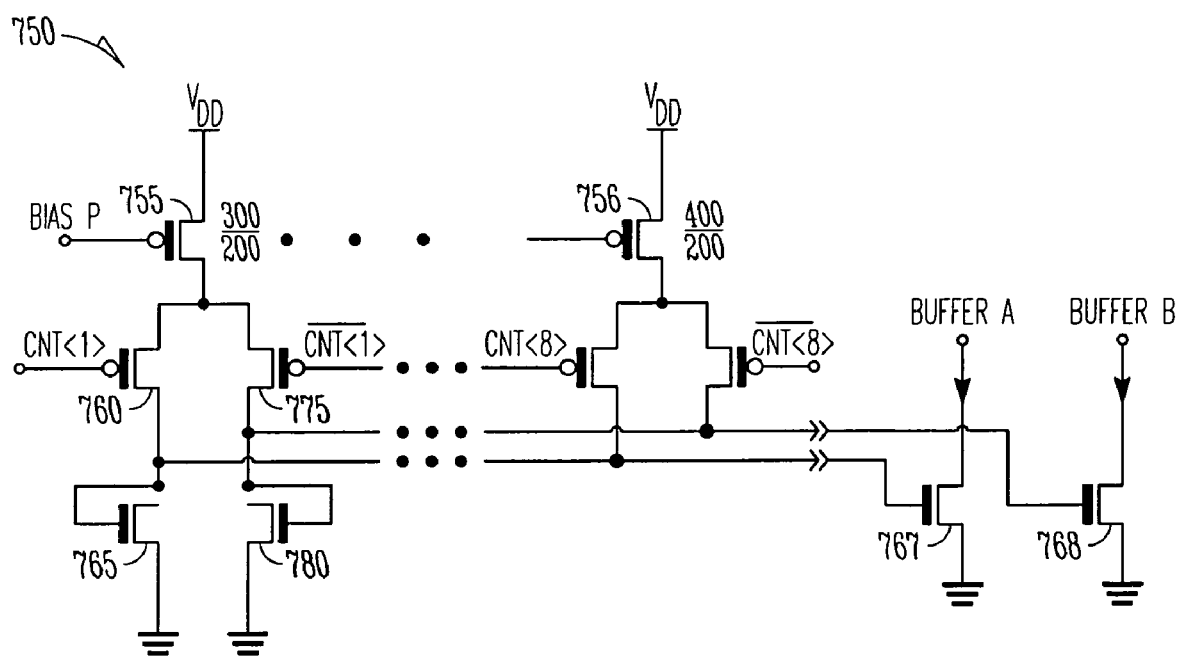
FIG. 7 is a schematic diagram of a DAC bit circuit connected to current mirror transistors, according to various embodiments of the invention.

FIG. 7 is a schematic diagram of a DAC bit circuit 750 connected to current mirror NMOS transistors 767, 768. When the control PMOS transistor 760 is on, current is sunk by NMOS transistor 765. The size of the current provided in each DAC bit circuit 750 may be determined by the size of the bias PMOS transistor 755 and the gate bias voltage, BIAS P. To form a first current mirror, another NMOS transistor 767 may have its gate connected to the gate of NMOS transistor 765. Because of the gate connections, the currents contributed by the individual DAC bit circuits 750 that have turned control PMOS transistor 760 "ON" are sunk by NMOS transistor 765. This current is reflected in mirror NMOS transistor 767, which sets the bias current for buffer A.

To form a second current mirror, another NMOS transistor 768 may have its gate connected to the gate of NMOS transistor 780. The currents contributed by the individual DAC bit circuits 750 that have control PMOS transistor 775 "ON" are sunk by NMOS transistor 780. This current is reflected in mirror NMOS transistor 768, which sets the bias current for buffer B. Because the gates of the control PMOS transistors 760, 775 can be connected to complement decodes, one of the control PMOS transistors 760, 775 may be ON while the other is OFF, reducing the amount of leakage current.

Turning back to FIG. 5, it can be seen that the digital input to the decoder 565 may include seven bits and the DAC 540 may include two sets of 128 current mirrors to provide currents of up to 128 times the current of a unit-sized current mirror. The decoder 565 in FIG. 5 can provide a decode output from its digital input to enable a first current mirror in the DAC 540 to provide an output current of up to 128 times the current of a unit-sized current mirror. The decoder 565 may also provide a decode output according to the complement of its digital input to enable a second current mirror to provide an output current that is a complement value of the output current in the first set. In this way, the sum of the output currents 558, 560 of the DAC 540 comprises a substantially constant value and the clock phase output OUTCK is proportional to the current steering of the output currents toward one or the other of the differential buffers 545, 546.

The phase interpolator circuit 500 may include a controller circuit 570. The controller circuit 570 may include logic circuitry to change the digital input 525 to the DAC 540 to sweep the clock phase of the output clock signal OUTCK. The digital input 525 may be incremented from 0 to 127 (big endian count) to interpolate the phase of the output clock between the 0° reference phase clock signal and the 45° reference phase clock signal. At a count of 127, the first differential buffer 545 may be given the least weight and the input to the first differential buffer 545 may be switched by the MUX to the 90° reference phase clock signal. In some embodiments, the MUX select bits 525 are sequentially changed to select the next reference phase clock signal. The controller circuit 570 may change the count to count from 127 to 0 (little endian count) to interpolate the phase of the output clock between the 45° reference phase clock signal and 90° reference phase clock signal. Thus, decoding may include a big endian count for 0° to 45°, 90° to 135°, 180° to 225°, and 270° to 315°, and a little endian count for 45° to 90°, 135° to 180°, 225° to 270°, and 315° to 360°.

FIG. 8 is a table illustrating sweeping an output clock phase. Again, for simplicity, only a three-bit digital input for eight steps is shown instead of 128 or more steps that might be used. Referring to FIGS. 5 and 8, it can be seen that only one count is needed by the DAC 540 to generate the two output currents. When the DAC digital input is at zero, corresponding to the case where the first differential buffer 545 is given the highest weight and the second differential buffer 546 is given the lowest weight, the interpolated phase of the output clock signal OUTCK is about 2.8° instead of 0°. This may be due to coupling capacitance between the two differential buffers 545, 546. When the count is at eight, corresponding to the case where the first differential buffer 545 is given the lowest weight and the second differential buffer 546 is given the highest weight, the interpolated phase at the output is about 42.2° instead of 45°. When the MUX select bits change from "000" to "001" to select the third reference clock having a phase of 90°, the interpolated phase at the output is about 47.8° instead of 45°.

It can be seen that the extra-long step of FIG. 3 is not evident in FIG. 8, and the phase interpolated clock signal (OUTCK) changes phase monotonically when the count at the digital input changes from big to little endian count types. FIG. 8 also shows that the phase interpolated clock signal changes phase monotonically when the count at the digital input changes from little to big endian count types. It can also be seen that the phase interpolated clock signal sweeps monotonically through less than 45° of phase shift from a first count of an endian count type to a last count of the same endian count type (e.g., about 42.2° for the big endian count). It also sweeps monotonically through approximately 45° of phase shift from the first count of an endian count type to a first count of a different endian count type (e.g., about 47.8° from the first big endian count to the first little endian count).

Turning now to FIG. 5, a complication with this approach may occur when there is a large difference in magnitude between DAC output currents, such as near the point where one differential buffer is near fully on and one is near fully off. Again using an example where the DAC 540 has 128 possible levels of output current, assume that the unit current size is 1 μA. Just after the case where one buffer is turned off and the other is full on (e.g., a DAC count moving from 0 to 1), the output currents of the DAC 540 can be adjusted to 1 μA and 127 μA. Only one 1 μA of current is available to charge the capacitance of the bias node of one of the differential buffers 545, 546 from the off state to the desired bias, while 127 μA is available to the other buffer. In contrast, when the differential buffers 545, 546 are both halfway on (e.g., a DAC count moving from 63 to 64), there is approximately 64 μA available to bias the differential buffers 545, 546. The larger amount of bias current available greatly reduces the settling time compared to the situation where the bias current is only 1 μA.

If a phase interpolator circuit is only to step a clock phase by a small amount, the disparity of settling times may not be a problem. However, in contrast to the examples of FIGS. 3, 4, and 8, there is no reason to limit the sweeping of a phase interpolator circuit 500 to a single DAC step. If faster sweeping is desired, the step size can be increased. This may become a concern if multiple phase interpolator circuits are used to sweep clock phases on a device or IC under test. A disparity in settling times between phase interpolator circuits 500 can limit the amount of clock drift that can be applied to such circuits under test.

According to some embodiments, the phase interpolator circuit 500 may include a variable capacitive load circuit 575. The variable capacitive load circuit 575 may operate to change the amount of capacitance seen by the DAC output currents according to how many DAC bits are engaged, changing according to the DAC output current to provide substantially equal settling times for any DAC position. This allows many phase interpolator circuits 500 to sweep clock phases at the same time without the concern of a temporary mismatch in settling time values.

Figure 9:
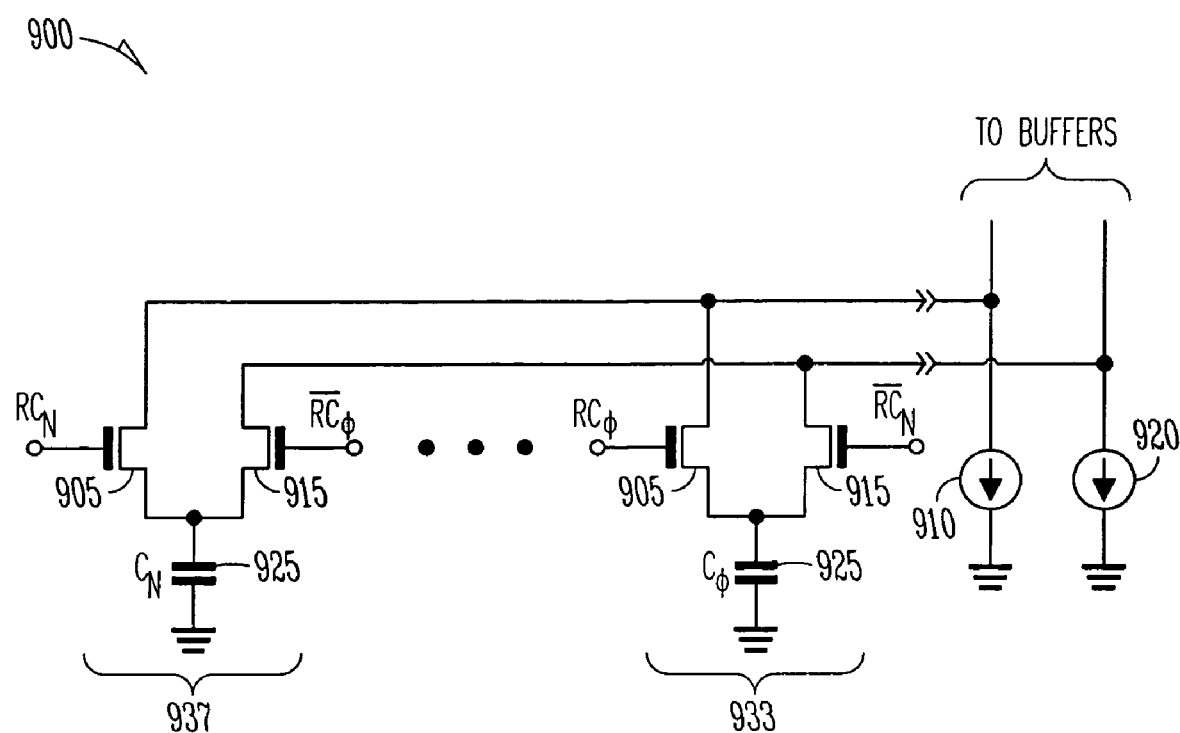
FIG. 9 is a schematic diagram of a portion of a variable capacitive load circuit, according to various embodiments of the invention.

FIG. 9 is a schematic diagram of a portion of an embodiment of a variable capacitive load circuit 900. The variable capacitive load circuit 900 may include one or more sub-circuits 930, 932 that may include a first switch 905 coupled to the first DAC current output 910, a second switch 915 coupled to the second DAC current output 920, and a capacitive load 925 coupled to the switches 905, 915. In FIG. 9, the DAC current outputs 910, 920 are shown as current sinks, but the DAC current outputs 910, 920 may be current sources. In the embodiment shown, the variable capacitive load circuit 900 includes N+1 of the sub-circuits, and the switches 905, 915 are n-channel transistors. In some embodiments, the capacitive loads 925 may include more than one size of capacitive load. For example, capacitive load $C_0$ may have a unit sized capacitance and capacitive load $C_N$ may have a capacitance that is approximately an integer multiple of the unit capacitance size, such as twice the unit capacitance size for example. In some embodiments, the variable capacitive load circuit 900 may include several capacitive loads that range in size from a unit capacitance to five times the unit capacitance, or greater.

To change the amount of capacitance seen by the DAC output currents according to how many DAC bits are engaged, the number of sub-circuits 933, 937 may be related to the number of DAC bits. In the illustrative example of a DAC having 128 possible levels of output current, the variable capacitive load circuit 900 includes seven sub-circuits (N=6). This provides $2^7=128$ capacitive loads to correspond to the 128 current levels. The sub-circuits 933, 937 include two switches 905, 915. The decoder 565 of FIG. 5 provides a decoder output 567 to enable the set of first switches 905 ($RC_0$ to $RC_N$) according to a decoding of the DAC digital input. A complement of the decoding is used to enable the set of second switches 915 ($\overline{RC_0}$ to $\overline{RC_N}$). As more DAC bits are added, the current increases along with the capacitive load. This causes the settling time of the differential buffers 545, 546 to be substantially uniform. The capacitive loads can be all unit-sized or weighted with different sizes in order to balance the settling times of each current setting.

In an implementation of DAC switching such as that shown in FIG. 8, the decoding for the capacitive load switches may be accomplished by going back and forth between big endian counting and little endian counting at the MUX boundaries (i.e., where the MUX select bits 525 are changed). In some embodiments, the decoding for the variable capacitive load circuit 900 may include a big endian count for 0° to 45°, 90° to 135°, 180° to 225°, and 270° to 315°, and the decoding may include a little endian count for 45° to 90°, 135° to 180°, 225° to 270°, and 315° to 360°.

Figure 10:
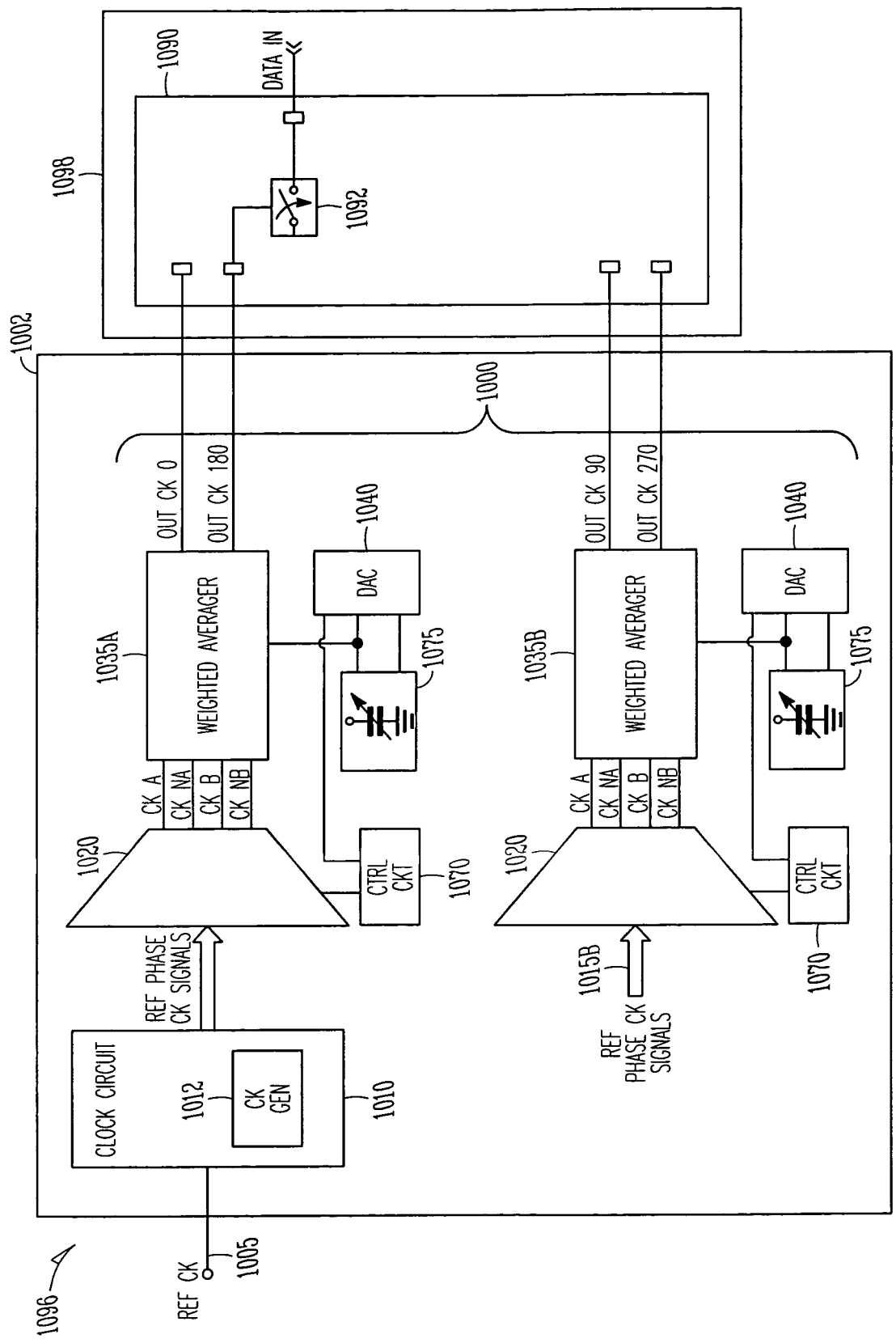
FIG. 10 is a block diagram of multiple phase interpolator circuits and a testing system, according to various embodiments of the invention.

FIG. 10 is a block diagram of multiple phase interpolator circuits 1000 used to sweep clock phases, as well as a testing system 1096, according to various embodiments of the invention. The phase interpolator circuits 1000 include a MUX 1020, a weighted averager circuit 1035A, 1035B, a DAC 1040, and a variable capacitive load circuit 1075. The weighted averager circuits 1035A, 1035B each may include two differential buffers (not shown, but may be similar to or identical to those shown in FIGS. 2 and 5). Each DAC 1040 receives a digital input from a controller circuit 1070. In some embodiments, each DAC may receive a digital input from the same controller circuit 1070. Each DAC may provide one or more outputs to bias the output drive of the differential buffers in the weighted averager circuits 1035A, 1035B. Variable capacitive load circuits 1075 are attached to the outputs of the DACs 1040.

A clock circuit 1010 may generate a set of reference phase clock signals 1015A, 1015B using clock generator 1012. The reference clock signals 1015A, 1015B are input to the MUX 1020. The reference clock signals 1015A, 1015B may be used to sweep the phase of output clock signals OUTCK0, OUTCK90 and their inverse clocks OUTCK180, OUTCK270.

The reference phase clock signals 1015B may be the same signals as 1015A or a different set of reference phase clock signals. If they are the same signals, then the multiple phase interpolator circuits 1000 may generate multiple output clocks that sweep the phase of an output clock signal OUTCK0, OUTCK90 through multiple forty-five degree phase segments. For example, the phase interpolator that includes the weighted averager 1035A may sweep an output clock signal from 0° to 45° while the phase interpolator that includes the weighted averager 1035B sweeps the output clock signal from 90° to 135°. The DACS 1040 may be the same size (i.e., having the same number of DAC bits) and the variable capacitive load circuits 1075 may provide substantially equal settling times for any DAC setting.

In some embodiments, the phase interpolator circuits 1000, which may form part of an IC package 1002, may be used to sweep the phase of one or more output clock signals usable by an IC under test 1090. The IC under test 1090 may be attached to a test fixture 1098, and may use one or more of the output clock signals OUTCK0, OUTCK90 for sampling received data (DATAIN) using sampling circuit 1092. In some systems, the reference clock 1005 used to generate the reference phase clock signals is in the range of approximately 0.8 gigahertz (GHz) to 1.6 GHz.

FIG. 11 is a flow diagram of a method 1100 of interpolating the phase of a clock signal. At block 1105, a first clock signal may be applied to a first buffer and a second clock signal may be applied to a second buffer, wherein the second clock signal is out of phase with the first clock signal. In some embodiments, the second clock signal is forty-five degrees out of phase with the second clock signal. In some embodiments, the first and second clock signals are selected from a plurality of reference phase clock signals using a MUX. The reference phase clock signals may be generated using a clock circuit, such as a PLL or a DLL for example. In some embodiments, the reference phase clock signals include eight reference phase clock phases substantially evenly spaced from about 0° to about 360°, and the first and second reference phase clock signals may be selected sequentially from among the eight reference phase clock signals.

At block 1110, the first and second clock signals that have been selected may be weighted using first and second outputs of a digital-to-analog converter circuit (DAC). The sum of the first and second DAC outputs may be a substantially constant output value. In some embodiments, the DAC outputs are current outputs and the sum of the first and second DAC current outputs is a substantially constant value of current.

At block 1115, a capacitive load on the first and second DAC outputs may be changed to balance the settling time of the buffers. The capacitance may be changed according to the first and second DAC outputs to provide substantially equal settling times for any DAC position, which is determined according to the DAC input digital value.

At block 1120, the weighted first and second clock signals may be summed to create a phase interpolated clock signal. In some embodiments, the first and second clock signals are weighted by receiving the first and second clock signals into first and second buffers (e.g., analog signal buffers), respectively, and the first and second DAC outputs may be used to weight the output of the first and second buffers respectively.

At block 1125, the phase interpolated clock signal phase may be swept through a plurality of phase values by changing the weighting of the first and second clock signals which may be accomplished in some embodiments, by changing the DAC input digital value. In some cases, the DAC converts a 7-bit digital input to 128 levels of current. Eight reference phase clock signals may be sequentially weighted by the DAC and summed to sweep the phase of an output clock through 1024 sub-phase intervals.

In some embodiments, the DAC input is changed by alternating the digital input between big endian counting and little endian counting when a new pair of clock signals is selected for combination. The method 1100 may include monotonically changing the clock phase of the phase interpolated clock signal when the digital input changes between big and little endian counting and changing the capacitive load value according to the counting. In some embodiments, sweeping the phase of the interpolated clock signal may include sweeping monotonically through less than forty-five degrees of phase shift from a first count of an endian count type to a last count of the same endian count type, and sweeping monotonically through approximately forty-five degrees of phase shift from the first count of an endian count type to a first count of a different endian count type.

In some embodiments, weighting the first and second buffers may include determining the first DAC output using a first decoding of a DAC digital input, and obtaining the second DAC output from a complement of the first decoding. Changing a capacitive load value may include selecting the capacitive load on the first DAC output using a second decoding of the DAC digital input, and selecting the capacitive load on the second DAC output using a complement of the second decoding.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations, or variations, or combinations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own.

What is claimed is:

1. A phase interpolator circuit, comprising:
a multiplexer circuit (MUX) to receive a plurality of clock signals at a corresponding plurality of MUX inputs and to output a first clock signal and a second clock signal that are out of phase with each other;
a digital to analog converter circuit (DAC) to convert a digital input to first and second DAC output currents such that a sum of the first and second DAC output currents is a substantially constant current value, wherein the first clock signal is to be weighted according to the first DAC output current and the second clock signal is to be weighted according to the second DAC output current;
a weighted averager circuit coupled to the MUX and the DAC, wherein the weighted averager circuit is to sum weighted first and second clock signals to output a phase interpolated clock signal; and
a variable capacitive load circuit coupled to the first and second DAC current outputs.

2. The phase interpolator circuit of claim 1, wherein the variable capacitive load circuit includes at least one capacitive load circuit, including:
a first switch coupled to the first DAC current output;
a second switch coupled to the second DAC current output; and
a capacitive load coupled to the switches.

3. The phase interpolator circuit of claim 2, wherein the at least one capacitive load circuit includes more than one size of capacitive load.

4. The phase interpolator circuit of claim 2, wherein the DAC includes:
a first current mirror to size the first DAC output current;
a second current mirror to size the second DAC output current; and
a decoder including:
a first decoder output, decoded according to a first decoding of the digital input, to select a first DAC output current level; and
a second decoder output to select a second DAC output current level according to a complement of the first decoding.

5. The phase interpolator circuit of claim 4, wherein the DAC decoder further includes:
a third decoder output, decoded according to a second decoding of the digital input, to enable the first switch; and
a fourth decoder output to enable the second switch according to a complement of the second decoding.

6. The phase interpolator circuit of claim 1, comprising:
a controller circuit coupled to the DAC, wherein the controller circuit includes a counter circuit to alternate a count at the DAC digital input between a big endian count type and a little endian count type when a different clock signal pair is output by the MUX, and wherein a clock phase of the phase interpolated clock signal changes monotonically when the count at the digital input changes between endian count types.

7. The phase interpolator circuit of claim 2, wherein the MUX includes:
select inputs coupled to the controller circuit, the controller circuit to select the first and second clock signals sequentially as a pair from among the plurality of clock signals, and wherein a clock phase of the phase interpolated clock signal changes monotonically when the controller circuit selects a different pair of clock signals.

8. The phase interpolator circuit of claim 2, wherein the second clock signal is forty-five degrees out of phase with the first clock signal, and wherein the phase interpolated clock signal sweeps monotonically through less than forty-five degrees of phase shift from a first count of a first endian count type to a last count of the first endian count type, and sweeps monotonically through approximately forty-five degrees of phase shift from the first count of the first endian count type to a first count of a second endian count type different from the first endian count type.

9. The phase interpolator circuit of claim 1, wherein the weighted averager circuit includes:
a first buffer to receive the first clock signal;
a second buffer to receive the second clock signal, wherein the first DAC output current is to adjust an output drive of the first buffer to weight the first clock signal and the second DAC output current is to adjust an output drive of the second buffer to weight the second clock signal; and
a summing node to couple to outputs of the first and second buffer to combine the first and second clock signals and produce the phase interpolated clock signal.

10. An integrated circuit package, comprising:
a multiplexer circuit (MUX) to receive a plurality of clock signals and to output a first and a second clock signal that are out of phase with each other;
a main digital to analog converter circuit (DAC) to convert a digital input to first and second DAC output currents such that a sum of the first and second DAC output currents is a substantially constant current value, wherein the first clock signal is to be weighted according to the first DAC output current and the second clock signal is to be weighted according to the second DAC output current;
a plurality of weighted averager circuits, wherein at least one of the plurality of weighted averager circuits is coupled to the MUX and the main DAC, wherein the at least one of the plurality of weighted averager circuits is to sum weighted first and second clock signals to output a phase interpolated clock signal; and
a variable capacitive load circuit coupled to the first and second DAC current outputs, wherein the capacitive load includes one or more unit-sized capacitors.

11. The integrated circuit package of claim 10, including:
a logic circuit coupled to the DAC digital input, the logic circuit to alternate between a big endian count type and a little endian count type when a different clock signal pair is output by the MUX, wherein a clock phase of the phase interpolated clock signal changes monotonically when the digital input changes between endian count types.

12. The integrated circuit package of claim 11, wherein the variable capacitive load circuit includes at least one capacitive load circuit, including:
a first n-channel switch coupled to the first DAC current output;
a second n-channel switch coupled to the second DAC current output; and
a capacitive load coupled to the switches.

13. The integrated circuit package of claim 11, wherein the variable capacitive load circuit includes:
at least one capacitive load circuit having a first capacitance; and
at least one capacitive load circuit having a second capacitance that is approximately an integer multiple of the first capacitance.

14. The integrated circuit package of claim 12, wherein the DAC includes:
a first current mirror to size the first DAC output current;
a second current mirror to size the second DAC output current; and
a decoder, including:
a first decoder output, decoded according to a first decoding of the digital input, to select a first DAC output current level;
a second decoder output to select a second DAC output current level according to a complement of the first decoding;

a third decoder output, decoded according to a second decoding of the digital input, to enable the first n-channel switch; and a fourth decoder output to enable the second n-channel switch according to a complement of the second decoding.

15. A method comprising:

receiving a first clock signal at a first buffer and receiving a second clock signal at a second buffer, wherein the second clock signal is out of phase with the first clock signal;

weighting first and second buffer outputs using first and second outputs of a digital-to-analog converter circuit (DAC), wherein a sum of the first and second outputs is a substantially constant output value;

changing a capacitive load on the first and second outputs to balance the settling time of the buffers;

summing the weighted first and second clock signals to create a phase interpolated clock signal; and sweeping a phase of the phase interpolated clock signal by changing the weighting of the first and second clock signals by changing an input of the DAC.

16. The method of claim 15, wherein weighting the first and second buffers includes determining the first output using a first decoding of the input of the DAC, and obtaining the second output from a complement of the first decoding; and wherein changing a capacitive load includes selecting the capacitive load on the first output using a second decoding of the input of the DAC, and selecting the capacitive load on the second output using a complement of the second decoding.

17. The method of claim 16, wherein changing input of the DAC includes alternating between big endian counting and little endian counting at input of the DAC when a different pair of clock signals is selected, comprising:

changing the capacitive load according to the counting; and monotonically changing the clock phase of the phase interpolated clock signal when the input of the DAC changes between the big endian counting and the little endian counting.

18. The method of claim 17, wherein receiving includes:

selecting the first and second clock signals sequentially as a pair from among a plurality of clock signals, wherein the first clock signal in the pair is forty-five degrees out of phase with the second clock signal in the pair.

19. The method of claim 18, wherein sweeping the phase of the interpolated clock signal includes:

sweeping monotonically through less than forty-five degrees of phase shift from a first count of a first endian count type to a last count of the first endian count type, and sweeping monotonically through approximately forty-five degrees of phase shift from the first count of the first endian count type to a first count of a second endian count type different from the first type.

20. The method of claim 15, including:

generating a plurality of clock signals that are out of phase with each other and having phase shifts evenly spaced within a range of zero degrees to 360 degrees; and selecting the first and second clock signals sequentially as a pair from among the plurality of clock signals, wherein the first clock signal in the pair is forty-five degrees out of phase with the second clock signal in the pair.

21. A system comprising:

a clock circuit to generate a plurality of clock signals from an input clock signal, the plurality of clock signals out of phase with each other and having phase shifts evenly spaced within a range of zero to 360 degrees; and at least one phase interpolator circuit coupled to the clock circuit, the at least one phase interpolator circuit including:

a multiplexer circuit (MUX) to receive a plurality of clock signals at MUX inputs and to output a first clock signal and a second clock signal that are out of phase with each other;

a digital to analog converter circuit (DAC) to convert a digital input to first and second DAC current outputs such that a sum of the first and second DAC output currents is a constant current value;

a weighted averager circuit coupled to the MUX and the DAC, wherein the weighted averager circuit is to combine weighted first and second clock signals to output a phase interpolated clock signal, and wherein the first clock signal is weighted according to the first DAC output current and the second clock signal is weighted according to the second DAC output current; and a variable capacitive load circuit coupled to the first and second DAC current outputs.

22. The system of claim 21, wherein the variable capacitive load circuit includes at least one capacitive load circuit having a first capacitance and at least one capacitive load circuit having a capacitance that is approximately an integer multiple of the first capacitance.

23. The system claim 21, wherein the DAC includes:

a first current mirror to size the first DAC output current;

a second current mirror to size the second DAC output current; and a decoder, including:

a first decoder output decoded from the digital input to select a first DAC output current level;

a second decoder output, that is a complement of decoded complement of the first decoder output, to select a second DAC output current level;

a third decoder output decoded from the digital input to select a variable capacitive load coupled to the first DAC current output; and a fourth decoder output that is a complement of the third decoder output, to select a variable capacitive load coupled to the second DAC current output.

24. The system of claim 21, including:

at least one weighted averager circuit to provide an output signal to an integrated circuit under test, the output clock signal having a phase changeable from about zero to about 360 degrees.

25. The system of claim 21, including:

first and second phase interpolator circuits to provide first and second output clock signals, respectively, to an integrated circuit under test, wherein the first and second output clock signals each have a phase changeable from about zero to about 360 degrees, and wherein the second output clock signal is out of phase with the first output clock signal.

26. The system of claim 25, wherein at least one of the output clock signals is usable by a receiving integrated circuit under test to sample a received data signal.

27. The system of claim 21, including:

a test fixture to attach to an integrated circuit under test, the test fixture to receive the phase interpolated clock signal.

* * * * *

UNITED STATES PATENT AND TRADEMARK OFFICE
CERTIFICATE OF CORRECTION

PATENT NO. : 7,443,219 B2  Page 1 of 1
APPLICATION NO. : 11/649435
DATED : October 28, 2008
INVENTOR(S) : Rausch It is certified that error appears in the above-identified patent and that said Letters Patent is hereby corrected as shown below:

In column 1, line 7, delete "11,649,434," and insert -- 11/649,434, --, therefor.

In column 14, line 29, in Claim 23, after "system" insert -- of --.

Signed and Sealed this

Third Day of March, 2009

JOHN DOLL
*Acting Director of the United States Patent and Trademark Office*